(12) United States Patent  
Tsuji et al.

(10) Patent No.: US 6,224,298 B1
(45) Date of Patent: May 1, 2001

(54) OBJECT TRANSPORT APPARATUS HAVING A FLOATING CONVEYING MEANS

(75) Inventors: Hiroyuki Tsuji, Nagoya; Takao Ohnishi, Nishikasugai-gun, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/142,329

(22) PCT Filed: Jan. 9, 1998

(86) PCT No.: PCT/JP98/00066

§ 371 Date: Nov. 27, 1998

§ 102(e) Date: Nov. 27, 1998

(87) PCT Pub. No.: WO98/30480

PCT Pub. Date: Jul. 16, 1998

(30) Foreign Application Priority Data

Jan. 10, 1997 (JP) .................................................. 9-003187
Dec. 16, 1997 (JP) .................................................. 9-346840

(51) Int. Cl.⁷ .................................................. B65G 53/16
(52) U.S. Cl. .......................... 406/88; 406/195; 414/676; 414/903
(58) Field of Search ............................... 406/83, 88, 191, 406/195, 86, 87; 414/676, 903; B65G 51/03

(56) References Cited

U.S. PATENT DOCUMENTS 3,731,823 * 5/1973 Goth ........................................ 302/31
5,634,636 * 6/1997 Jackson et al. ........................ 406/87

FOREIGN PATENT DOCUMENTS 62-295825 12/1987 (JP) .
4-94320 3/1992 (JP) .
5-74684 10/1993 (JP) .
6-9052 1/1994 (JP) .
7-80011 3/1995 (JP) .
8-91623 4/1996 (JP) .
142568 * 3/1961 (RU) ...................................... 406/88
662460 * 5/1979 (RU) ................................... 406/195

* cited by examiner

*Primary Examiner*—Christopher P. Ellis
*Assistant Examiner*—Joe Dillon, Jr.
(74) *Attorney, Agent, or Firm*—Burr & Brown

(57) ABSTRACT

Grooves for constructing transport passages 12 for transporting semiconductor chips 28 are provided (the grooves are provided in parallel to one another in a number corresponding to quality levels of the semiconductor chips 28). An air blow pipe 27 is provided at a starting end Pa of the transport passage 12 in a transport direction (direction indicated by the arrow in FIG. 7) to give the thrust for moving the semiconductor chips 28 in the transport direction. A large number of air-jetting holes 26 for floating the semiconductor chips 28 are provided through a transport surface. Especially, the air-jetting holes 26 are provided at a terminal end in the transport direction in a number larger than those for the other portions. Thus, the floating amount of the semiconductor chip 28 is maximized at the terminal end. A plurality of slits 29 are provided vertically through a terminal end wall 20a in the transport direction. Accordingly, a transport system is realized, in which the object is transported in one direction while floating the object by means of air. Especially, it is possible to realize the automatic operation for picking up individual objects one by one.

13 Claims, 11 Drawing Sheets

F I G.6
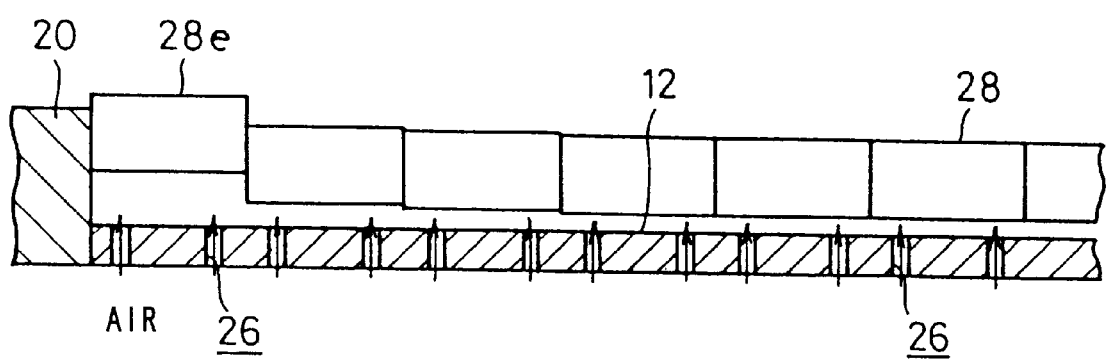

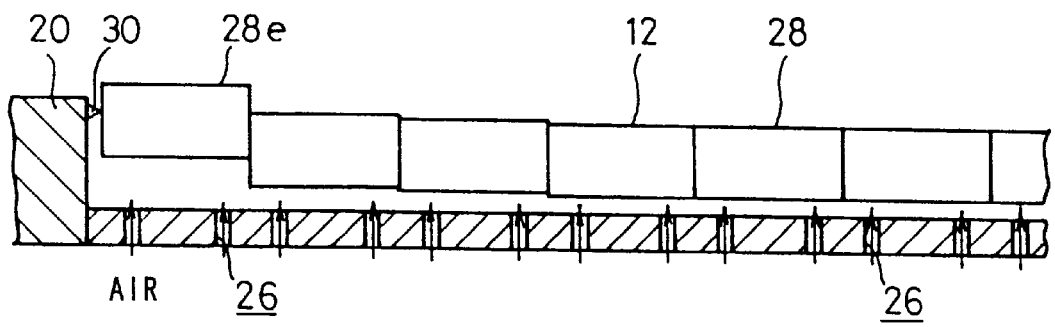
F I G. 9A
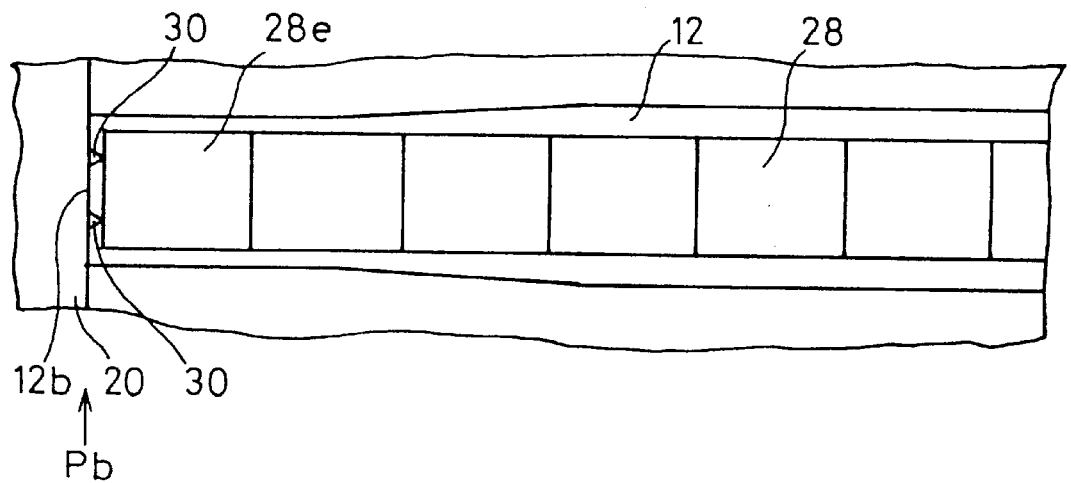
F I G. 9B

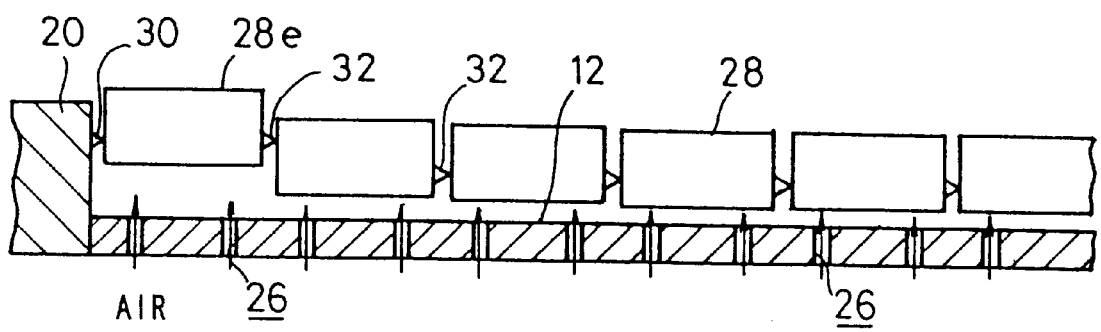
F I G. 10A
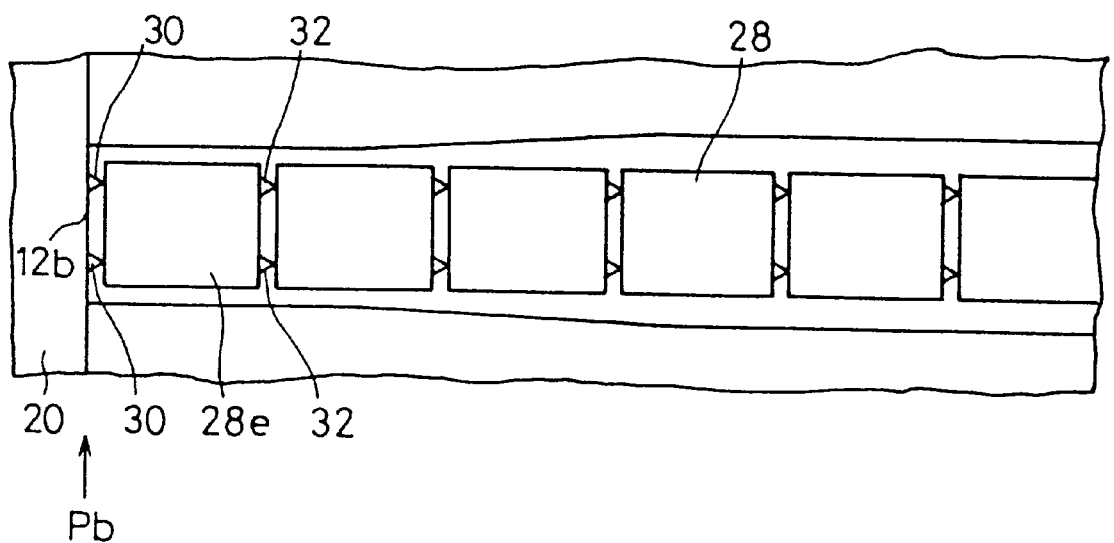
F I G. 10B
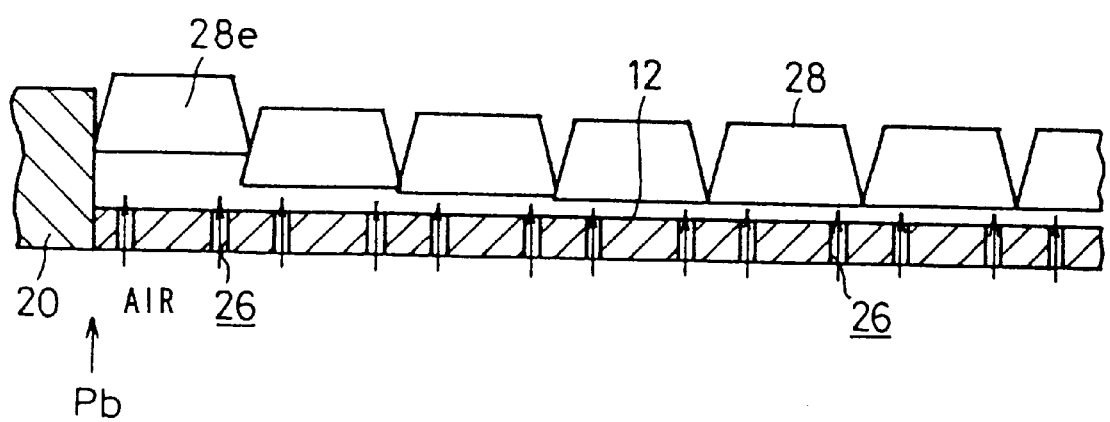
F I G. 11

OBJECT TRANSPORT APPARATUS HAVING A FLOATING CONVEYING MEANS

TECHNICAL FIELD

The present invention relates to an object transport apparatus for transporting an object (various electronic parts such as semiconductor chips) placed in a production process to the next production step, or for transporting a completed object to the next assembling step.

BACKGROUND ART

In general, a container, which is composed of a box with an open top, is often used in the production line for an object (various electronic parts such as semiconductor chips), in order to transport a large number of electronic parts to the next processing step or to a storage chamber or the like.

For example, when a large number of electronic parts or the like (hereinafter simply referred to as "workpieces") are transported by using the container in the production line, then the large number of workpieces are randomly introduced into the container, and they are automatically transported to the next processing step or to the storage chamber by using, for example, a belt conveyer and a transport arm.

A method is known, which is used when the object, which is subjected to the transport, has a small size, for example, when the object is a semiconductor chip. In this method, a transport passage is provided with a large number of holes, and air is discharged through the large number of holes to transport the object.

According to this method, a large number of small-sized objects can be smoothly transported. Therefore, this method is advantageous to shorten the time required to perform the transport.

However, the conventional transport apparatus based on the use of air merely transports the objects in one direction by discharging air. Therefore, an inconvenience arises in that the objects are closely contacted with each other at the terminal end of the transport passage in the transport direction, and it is difficult to pick up the object which has arrived at the terminal end.

Especially, in the case of the semiconductor chip, for example, it is necessary to pick up individual objects one by one. In such a case, individual objects are picked up one by one by manual operation, involving a problem that it is impossible to realize the fully automatic operation for the transport system.

The present invention has been made taking such problems into consideration, an object of which is to provide a transport system for transporting an object in one direction while floating the object by means of air, especially an object transport apparatus which makes it possible to realize automatic operation to pick up individual objects one by one.

DISCLOSURE OF THE INVENTION

According to the present invention, there is provided an object transport apparatus provided with at least one line of groove for constructing a transport passage for transporting an object, the object transport apparatus comprising a mechanism for moving the object in a transport direction, a floating mechanism, and a floating-accelerating mechanism disposed at a terminal end in the transport direction.

Accordingly, at first, the floating mechanism for the object is operated so that a large number of objects, which are placed on the object transport surface, are slightly floated upwardly. In this situation, the mechanism for moving the object in the transport direction is operated. Thus, the large number of objects are transported together toward the downstream side in the transport direction. Further, the floating-accelerating mechanism for the object is provided at the terminal end in the transport direction. Therefore, the object, which has arrived at the terminal end of the transport passage in the transport direction, is positioned in a state in which the concerning object is floated to a position higher than those of the other objects. Accordingly, the object, which is positioned at the terminal end in the transport direction, can be easily picked up without using any manual operation. It is possible to realize automatic operation for picking up a large number of transported individual objects one by one. This results in fully automatic operation for the entire object transport system.

In an embodiment of the present invention, it is preferable that the mechanism for moving the object in the transport direction comprises any one of, or a combination of a means for inclining the transport passage downwardly by a predetermined angle toward the transport direction, a large number of air-jetting holes which are formed through a transport surface of the transport passage so that air is jetted toward the transport direction, and a pushing means provided toward the transport direction at a starting end of the transport passage in the transport direction.

The use of the means for inclining the transport passage downwardly by the predetermined angle toward the transport direction allows the large number of objects to be transported in accordance with their own weights to the downstream side in the transport direction. In this embodiment, if the angle of inclination is too large, the objects are overlapped with each other in an excessive degree at the terminal end in the transport direction. Therefore, the angle of inclination is preferably not more than 2°. If the angle of inclination is too small, the ability to transport the object is deteriorated. Therefore, the angle of inclination is preferably not less than 0.5°. However, there is no limitation thereto.

The large number of objects are transported toward the downstream side in the transport direction by allowing the large number of air-jetting holes to penetrate through the transport surface of the transport passage so that air is jetted toward the transport direction, or by providing the pushing means toward the transport direction at the starting end of the transport passage in the transport direction.

The "air-jetting holes" referred to herein indicate a large number of through-holes which are formed mechanically, and a large number of holes of a porous material such as sintered metal. In the present invention, the jetting angle of the air-jetting holes provided through the transport surface may be determined to be an appropriate angle considering the shape and the weight of the object in view of the balance with the ability as an object-floating mechanism as described later on. The air-jetting holes may also serve as the object-floating mechanism, and hence it is possible to reduce the cost owing to the simplification of the apparatus. Further, it is possible to simplify the handling operation for the apparatus, and it is possible to improve the reliability of the apparatus.

A method based on the use of air discharge, or a mechanical pushing method such as those based on the use of a piston may be appropriately selected and used as the pushing means. Accordingly, it is possible to control the transport ability in an independent manner. The applicable range of the operating conditions include, for example, the shape of the object and the transport speed. Especially, it is possible to avoid the problem which would be otherwise caused that the object would be sunk without being floated at the starting end of the transport passage at which the object is introduced.

In another embodiment, it is preferable that the floating mechanism has a large number of air-jetting holes which are formed through an object transport surface of the transport passage. The air is jetted upwardly from the air-jetting holes in a direction perpendicular to the transport surface. By doing so, all of the large number of objects placed on the transport passage can be appropriately floated, and it is possible to avoid any retention of the object on the transport passage. That is, all of the large number of objects can be efficiently transported in the transport direction.

In still another embodiment, the floating-accelerating mechanism may appropriately select and use any one of, or a combination of a means for allowing a planar configuration of the transport passage to have a shape for maximizing a floating amount of the object at the terminal end in the transport direction, and a means with a large number of air-jetting holes which are formed through an object transport surface of the transport passage for increasing an air-jetting amount of the air-jetting holes of the large number of air-jetting holes disposed at the terminal end in the transport direction as compared with an air-jetting amount of the air-jetting holes disposed at positions other than the terminal end in the transport direction.

When the planar configuration of the transport passage is allowed to have the shape for maximizing the floating amount of the object at the terminal end in the transport direction, then the object, which has arrived at the terminal end of the transport passage in the transport direction, is in a state of being floated higher than the other objects, and the object is positioned highly accurately.

The same effect can be also obtained when the air-jetting amount of the air-jetting holes disposed at the terminal end in the transport direction is increased as compared with the air-jetting amount of the air-jetting holes disposed at the positions other than the terminal end in the transport direction. In this embodiment, the following methods are available to increase the air-jetting amount at the terminal end in the transport direction. That is, the number of the air-jetting holes is increased as compared with those for the portions other than the terminal end in the transport direction. Alternatively, the air-jetting amount per one air-jetting hole is increased.

In still another embodiment of the present invention constructed as described above, it is preferable that the grooves for forming the object transport passages are provided in parallel to one another in a number of lines corresponding to quality levels of the objects. In this embodiment, the objects are introduced into the respective grooves corresponding to the quality levels acknowledged for each of the objects in the previous step (for example, in the inspection step). Accordingly, the objects of approximately the same quality level can be gathered in each of the transport passages. After that, for example, in the assembling step, a certain apparatus or device can be assembled by using the objects each having approximately the same quality transported via one transport passage. Therefore, it is possible to improve the quality of the apparatus or device.

In still another embodiment of the present invention constructed as described above, it is preferable that the air-jetting holes are provided at three points or more with respect to a projected area of the object. Accordingly, all of the large number of objects placed on the transport passage can be floated without any fluctuation. Thus, it is possible to avoid retention of the objects on the transport passage. That is, all of the large number of objects can be efficiently transported in the transport direction.

In still another embodiment of the present invention constructed as described above, it is preferable that the transport passage has a planar configuration in which a clearance area is decreased stepwise in the transport direction provided that the clearance area is an area obtained by subtracting a projected area of the object from an area of an object transport surface of the transport passage. Accordingly, the larger the clearance area is, the more easily the air jetted from the air-jetting holes tends to leak through the clearance. Therefore, the floating amount of the object is decreased. On the contrary, the smaller the clearance area is, the more it is for air jetted from the air-jetting holes to leak through the clearance. Therefore, the floating amount of the object is increased. In the present invention, the clearance area is decreased stepwise in the transport direction. Accordingly, the floating amount is increased as the object is moved to the downstream in the transport direction. The floating amount of the object is maximized when the object arrives at the terminal end in the transport direction.

In still another embodiment of the present invention constructed as described above, it is preferable that a slit is provided through a terminal end wall of the transport passage in the transport direction. Accordingly, a part of the air discharged from the air-jetting holes leaks at the terminal end in the transport direction through the slit toward the outside of the transport passage in the transport direction and in the upward direction. Thus, it is possible to adjust the floating amount of the object, and it is possible to smoothly move (transport) the object in the transport direction. Further, it is possible to avoid the problem which would be otherwise caused that the terminal end wall in the transport direction is in a state of so-called drift in which foreign matters are deposited, and the foreign matters adhere to the object which collides with the terminal end wall. When a plurality of objects having different quality levels are transported by using a plurality of grooves as the transport passages, the transport condition can be individually adjusted by changing the condition of slit formation for each of the transport passages.

In still another embodiment of the present invention constructed as described above, it is preferable that a projection is provided on a terminal end wall of the transport passage in the transport direction. For example, when the terminal end of the transport passage is formed by a side wall, the object, which has arrived at the terminal end portion in the transport direction, makes surface-to-surface contact with the terminal end wall. Therefore, in order to decrease the inclination of the object located at the terminal end portion in the transport direction so that the object is floated, it is necessary that the air-jetting force exerted on the object is not less than the contact frictional force of the surface-to-surface contact. Considering the balance with respect to the floating amount of the object under the transport process, it is feared that the adjustment for the air-jetting amount may be difficult. Further, it is also feared that the problem of adhesion of foreign matters to the object may occur as described above. However, in the present invention, the projection is provided on the terminal end wall in the transport direction. Therefore, the object, which has arrived at the terminal end portion in the transport direction, abuts against the projection in point-to-point contact or in line-to-line contact therewith. Accordingly, it is possible to decrease the air-jetting force exerted on the object, and it is easy, for example, to adjust the air-jetting amount. Further, the adhesion of foreign matters to the object also disappears.

In still another embodiment of the present invention constructed as described above, it is preferable that a projection is provided at a rear end of the object in the transport direction. Accordingly, the object, which has arrived at the terminal end in the transport direction, abuts against the projection formed on the terminal end wall in the transport direction, and the object abuts against the following object, in point-to-point contact or in line-to-line contact therewith. Therefore, the air-jetting force exerted on the object can be further decreased. Thus, it is possible to realize simplification of the control system and the structure of the air-jetting mechanism.

In still another embodiment of the present invention constructed as described above, it is preferable that the object is an electronic part. In the present invention, when the large number of objects are transported in the same direction, only the object, which is located at the terminal end in the transport direction, is floated to be higher than the other objects. Therefore, it is extremely easy to pick up the individual objects one by one. As a result, the present invention is sufficiently applicable when the object is the electronic part. Thus, it is possible to realize simplification of the semiconductor production steps, and it is possible to realize the fully automatic operation.

In still another embodiment of the present invention constructed as described above, it is preferable that a length of the object along the transport direction is continuously decreased in a direction of its height. In this embodiment, for example, when the object arrives at the terminal end in the transport direction, the line-to-line contact is made between the concerning object and the terminal end wall and between the concerning object and the following object respectively. Especially, when the object located at the terminal end in the transport direction is floated upwardly by the air-jetting force, the rear end of the concerning object is moved along the tapered surface (the surface which is upwardly inclined in a direction to make separation from the terminal end in the transport direction) disposed at the front end of the following object. As the object located at the terminal end in the transport direction is floated upwardly, the following object is moved while making advance into the space under the object located at the terminal end in the transport direction. Thus, the object located at the terminal end in the transport direction is floated upwardly easier than the other objects.

BRIEF DESCRIPTION OF THE DRAWINGS

FIG. 6 illustrates the floating state of the semiconductor chips transported over the transport passage in the transport apparatus according to the embodiment of the present invention.

FIG. 9A shows a sectional view illustrating the floating state of the semiconductor chips transported over a transport passage in a transport apparatus according to a third modified embodiment.

FIG. 9B shows a plan view illustrating the floating state of the semiconductor chips transported over the transport passage in the transport apparatus according to the third modified embodiment.

FIG. 10A shows a sectional view illustrating the floating state of the semiconductor chips transported over a transport passage in a transport apparatus according to a fourth modified embodiment.

FIG. 10B shows a plan view illustrating the floating state of the semiconductor chips transported over the transport passage in the transport apparatus according to the fourth modified embodiment.

FIG. 11 illustrates the floating state of the semiconductor chips transported over a transport passage in a transport apparatus according to a fifth modified embodiment.

BEST MODE FOR CARRYING OUT THE INVENTION

Illustrative embodiments, in which the object transport apparatus according to the present invention is applied, for example, to a transport apparatus for transporting a large number of semiconductor chips (hereinafter simply referred to as "transport apparatus according to the embodiment"), will be explained below with reference to FIGS. 1 to 12.

Figure 1:
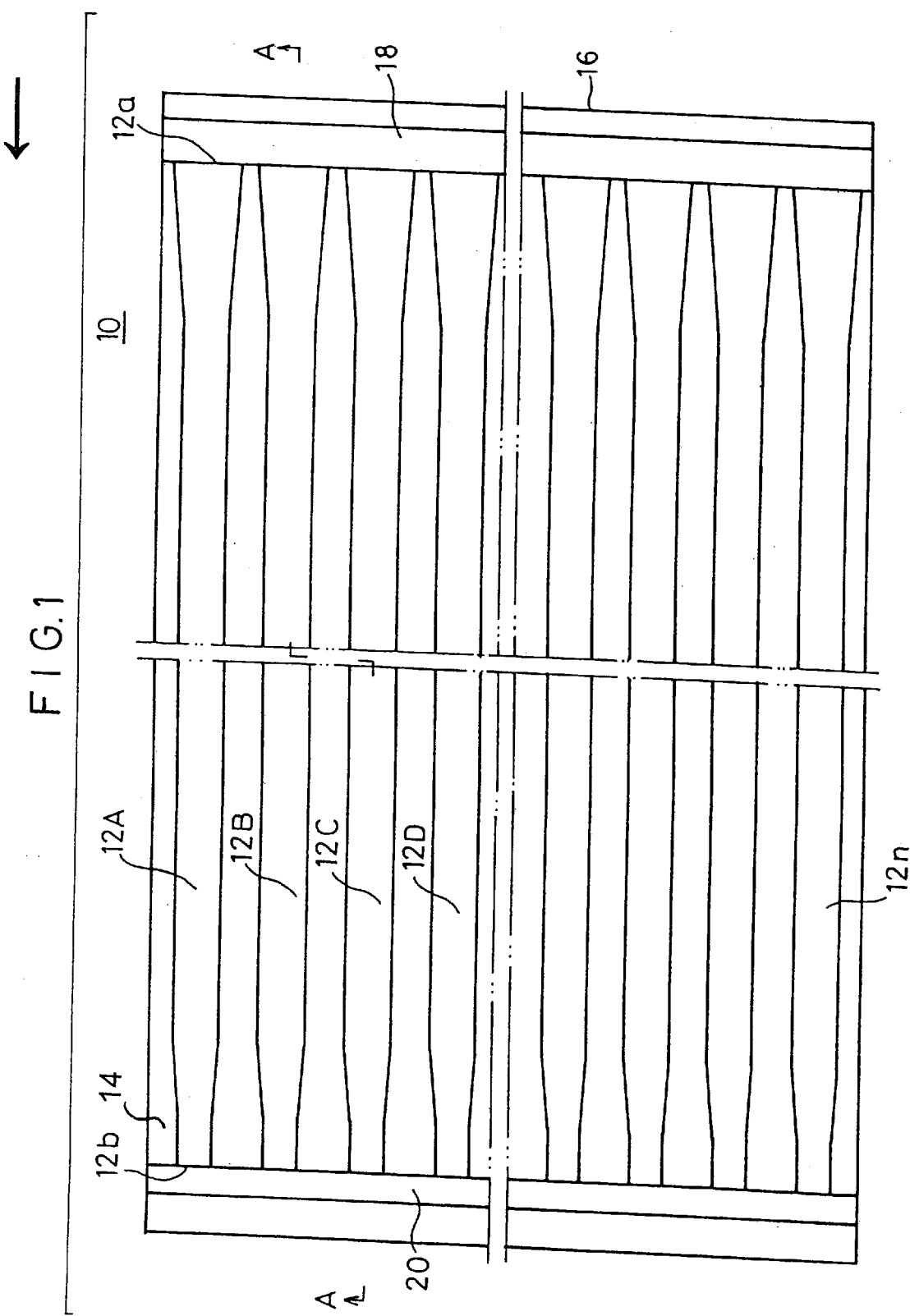
FIG. 1 shows a plan view illustrating an arrangement of an illustrative embodiment in which the object transport apparatus according to the present invention is applied, for example, to a transport apparatus for transporting a large number of semiconductor chips (hereinafter simply referred to as "transport apparatus according to the embodiment").
Figure 2:
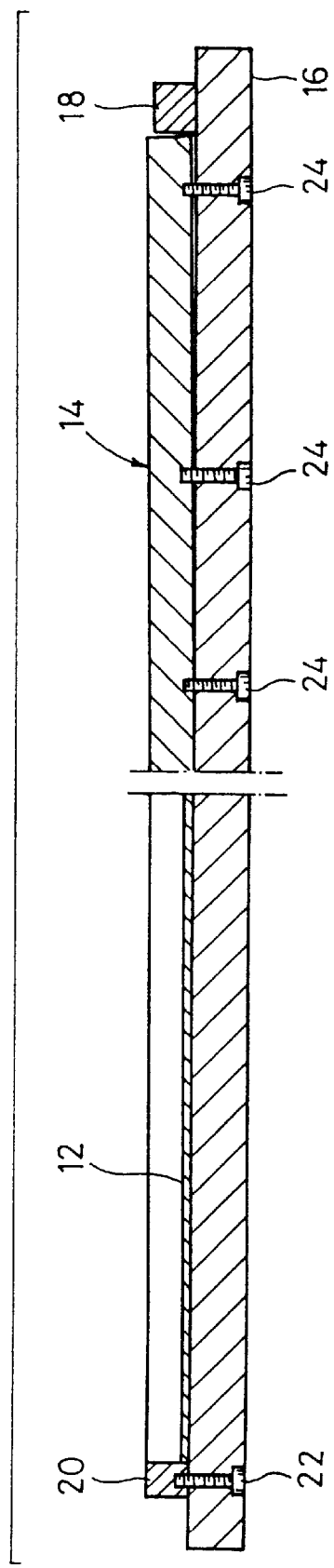
FIG. 2 shows a sectional view taken along a line A—A shown in FIG. 1.

As shown in FIGS. 1 and 2, the transport apparatus 10 according to a first embodiment of the present invention comprises a main apparatus body 14 formed with a plurality of grooves in parallel to one another for constructing transport passages 12 for transporting a large number of semiconductor chips, a base pedestal 16 for supporting the main apparatus body 14 in a state of being inclined by a predetermined angle with respect to the transport direction, a starting end wall 18 having a prism-shaped configuration provided commonly for starting end openings 12a of the plurality of transport passages 12 of the main apparatus body 14, and a terminal end wall 20 also having a prism-shaped configuration provided commonly for terminal end openings 12b of the plurality of transport passages 12 of the main apparatus body 14.

Those appropriately selected and adopted as the material for constructing the main apparatus body 14 include, for example, metals such as aluminum, resin substrates such as glass epoxy, ceramics such as ceramic partially stabilized zirconia and silicon nitride, and glass. When metal is used, it is preferable to use those having flatness and less warpage, and it is preferable to use those having a large Young's modulus. Those appropriately usable as the processing method include, for example, plastic working, laser beam machining, electric discharge machining, punching processing based on punching, and processing based on drilling. As shown in FIG. 2, the starting end wall 18 and the terminal end wall 20 are fixed on the base pedestal 16 by using, for example, a plurality of screws 22 screwed from the side of the bottom surface of the base pedestal 16. A placing surface for the main apparatus body 14 is defined by mutually opposing surfaces of the starting end wall 18 and the terminal end wall 20 and an upper surface of the base pedestal 16. The main apparatus body 14 is placed on the placing surface defined on the upper surface of the base pedestal 16. The main apparatus body 14 is fixed on the base pedestal 16 by means of screws 24 screwed from the side of the bottom surface of the base pedestal 16.

Especially, the main apparatus body 14 is supported, for example, at an angle of inclination of 1° with respect to the placing surface (transport surface) of the base pedestal 16 by appropriately adjusting the screwing amount of the screw 24 screwed into the main apparatus body 14. The portion of the starting end opening 12a of the transport passage 12 (hereinafter simply referred to as "starting end Pa") is lifted upwardly with respect to the base pedestal 16. The portion of the terminal end opening 12b of the transport passage 12 (hereinafter simply referred to as "terminal end Pb") is supported to make contact with the placing surface of the base pedestal 16.

Figure 3:
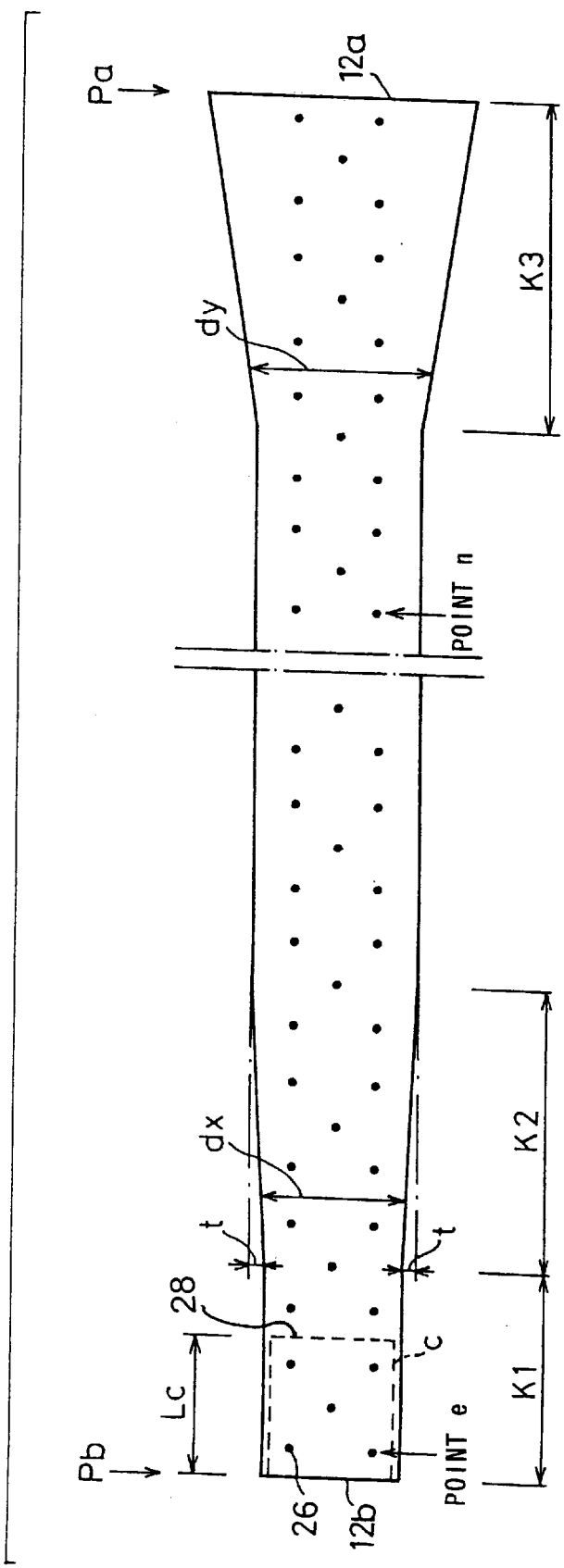
FIG. 3 shows a plan view illustrating a transport passage of the transport apparatus according to the embodiment of the present invention.

As shown in FIG. 3, the planar configuration of each of the transport passages 12 is formed such that the configuration of the groove width is changed in a stepwise manner from the starting end Pa to the terminal end Pb. In the embodiment of the present invention, the width d1 is constant and smallest in an interval (region) K1 corresponding to a length which is 1.5 times as long as a length Lc of one chip in the direction from the terminal end Pb toward the starting end Pa. The width dx in an interval (region) K2 corresponding to the next length of about 20 mm is set to make continuous change to become wider toward the starting end Pa. The width dx is designed to become wider by a predetermined length t (about 0.4 mm) on both sides respectively over the interval K2.

When the preceding semiconductor chip 28 is picked up in the interval K1, it is feared that the floating state of the following semiconductor chips 28 may become unstable, and for example, the following semiconductor chips 28 may meander, or a plurality of semiconductor chips 28 may be transported in an overlapped state. However, in the present invention, the width d1 of the interval K1 is set to be the minimum (in a degree of being slightly larger than the width of the semiconductor chip 28) as described above. Thus, the problem is avoided, which would be otherwise caused, for example, such that the semiconductor chips 28 meander, and they are caught by the side wall and the terminal end wall of the transport passage 12. Further, the length of the interval K1 is set to be 1.5 times as long as the length Lc of one chip, and the interval K2 is provided in which the width dx is gradually enlarged. Thus, the semiconductor chips 28 can be floated gradually one by one, and it is possible to avoid the overlap of the semiconductor chips 28.

The transport passage 12 is set such that the width dy is continuously widened in an interval K3 ranging from a point separated by a predetermined distance from the starting end Pa toward the terminal end Pb, to the starting end Pa. The increasing ratio of the width dy in the interval K3 is larger than the increasing ratio in the interval K2, giving a structure in which the semiconductor chip 28 is easily received. Therefore, when the semiconductor chip 28 is introduced into each of the transport passages 12, it is unnecessary to perform highly accurate positional control for a transport arm used to introduce the semiconductor chip 28 into the transport apparatus 10. Thus, it is sufficient to use a simple mechanism and a simple circuit system.

Figure 4:
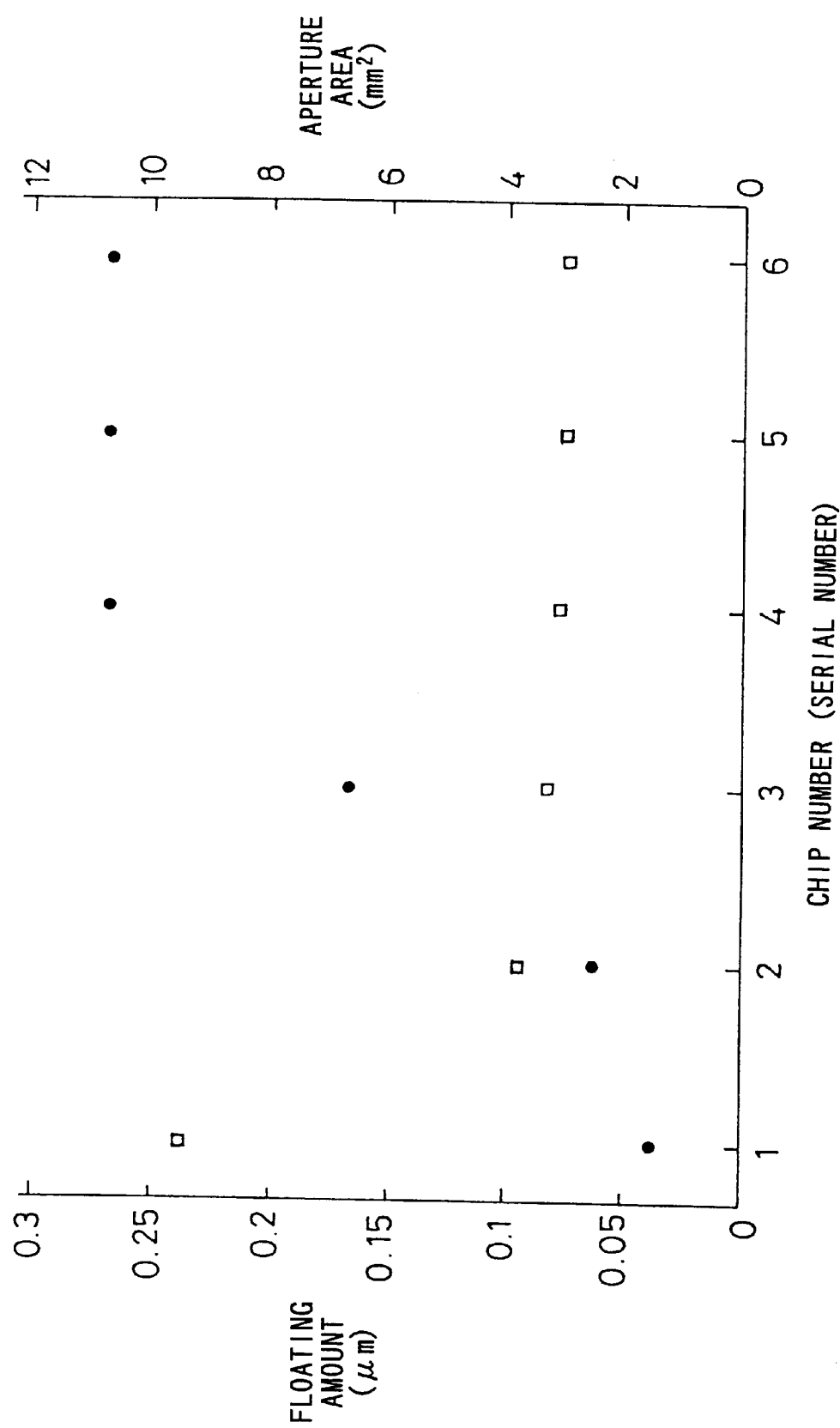
FIG. 4 shows characteristics of the transport apparatus according to the embodiment of the present invention, illustrating the difference in floating amount of each chip with respect to the aperture area of the transport passage.
Figure 5A:
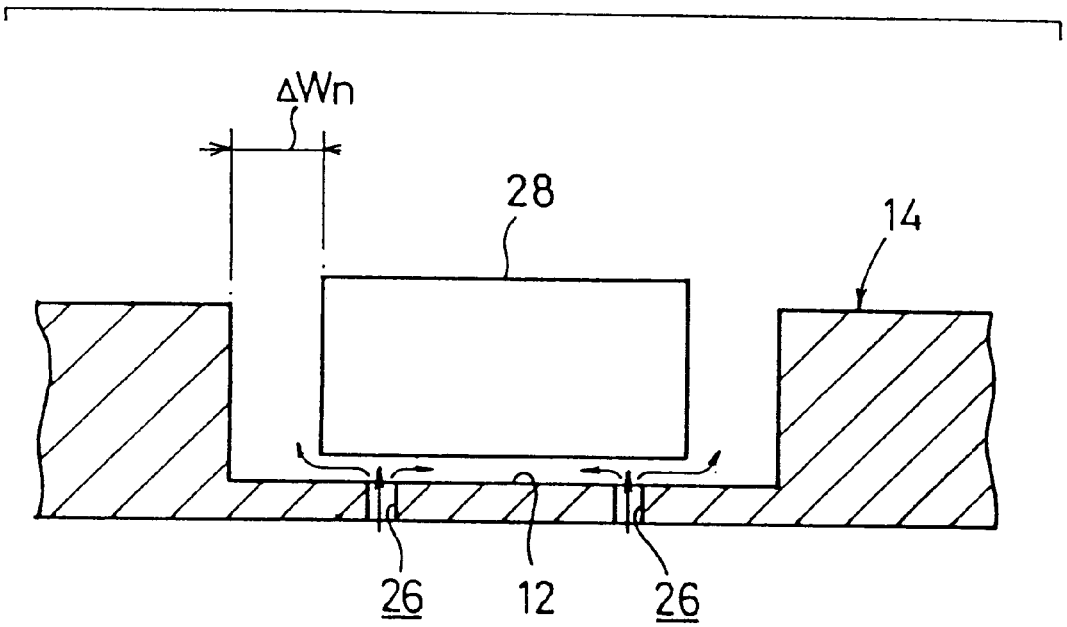
FIG. 5A illustrates the floating amount of the semiconductor chip based on a clearance distance at a point in the vicinity of the starting end.
Figure 5B:
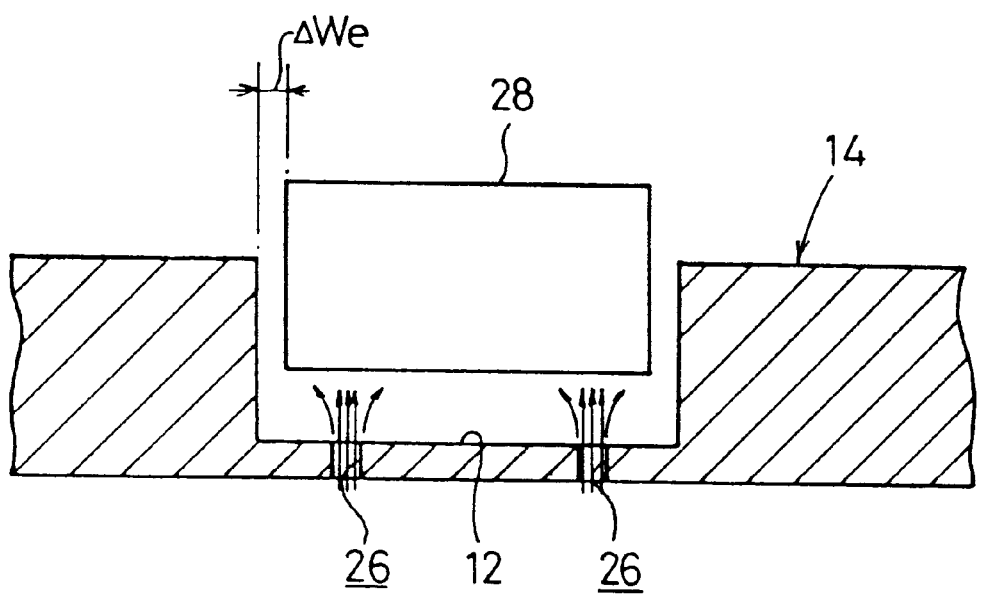
FIG. 5B illustrates the floating amount of the semiconductor chip based on a clearance distance at a point in the vicinity of the terminal end.

The stepwise change of the groove width of each of the transport passages 12 in the main apparatus body 14 may be appreciated as shown in FIG. 4 on the basis of the aperture area with respect to the chip length Lc on the transport passage 12. That is, the aperture area in a range of one chip length Lc from the terminal end Pb, i.e., the aperture area for the first chip as counted from the terminal end Pb is not less than about 1.38 mm$^2$. The aperture area for the next one chip length Lc (aperture area for the second chip) is not less than about 2.740 mm$^2$. Similarly, the respective aperture areas for the third chip and the fourth chip are not less than 6.75 mm$^2$ and not less than 10.75 mm$^2$ respectively. The aperture areas for the fourth chip and the followings are approximately the same up to the point of start of the interval K3.

In other words, the transport passage 12 has a planar configuration in which the clearance area is decreased stepwise in the transport direction provided that the clearance area is an area obtained by subtracting the projected area of the semiconductor chip 28 from the aperture area for the chip length Lc of the groove bottom surface. The clearance distance ΔWe (see FIG. 5B), for example, at a point e in the vicinity of the terminal end Pb in FIG. 3 is narrower than the clearance distance ΔWn (see FIG. 5A), for example, at a point n in the vicinity of the starting end Pa.

A large number of air-jetting holes 26 are formed through the groove bottom surface (chip transport surface) of each of the transport passages 12. The respective air-jetting holes 26 are communicated via conduits with an air supply system comprising, for example, an unillustrated air pump and an electromagnetic valve. Therefore, the air is introduced from the air pump, for example, via the electromagnetic valve and the conduits to the respective air-jetting holes 26 (air pressure=about 0.06 kgf/cm$^2$) on the basis of the system start operation for the air supply system. The air is uniformly jetted upwardly from the air-jetting holes 26.

The air-jetting holes 26 are provided at not less than three points for the projected area of the semiconductor chip 28. In the embodiment of the present invention, the air-jetting holes 26 are provided at five points for the projected area of the semiconductor chip 28. Specifically, as shown in FIG. 3, for example, assuming that the projected configuration of one chip (indicated by broken lines c) is a rectangular configuration, the air-jetting holes 26 are provided at portions corresponding to the four corners and at a portion corresponding to the center. In the embodiment of the present invention, the air-jetting hole 26 has a diameter of 0.2 mm.

Next, the operation of the transport apparatus 10 according to the embodiment of the present invention will be explained with reference to FIGS. 5 and 6.

At first, as shown in FIG. 6, the air is discharged through the large number of air-jetting holes 26 provided through the groove bottom surface of the transport passage 12. Accordingly, the large number of semiconductor chips 28 introduced into the transport passage 12 are slightly floated upwardly. In this situation, the transport passage 12 is inclined downwardly by the predetermined angle (1° in this embodiment) toward the transport direction. Therefore, the large number of semiconductor chips 28 are transported together to the downstream side in the transport direction owing to their own weights.

Especially, in the embodiment of the present invention, the planar configuration is given in which the groove width of the transport passage 12 is changed stepwise from the starting end Pa to the terminal end Pb, and the aperture area (or the clearance area) is decreased stepwise in the transport direction.

Accordingly, as shown in FIG. 6, the floating amount of the semiconductor chip 28 transported over the transport passage 12 is increased as the semiconductor chip 28 is moved toward the downstream side in the transport direction. The floating amount of the semiconductor chip 28e arrived at the terminal end Pb is at its maximum. FIG. 4 shows the difference in floating amount concerning the respective semiconductor chips 28 arranged over the transport passage 12. In FIG. 4, the horizontal axis indicates the serial number of the transported semiconductor chip 28 as counted from the terminal end Pb. The floating amount is indicated by blanked squares, and the aperture area is indicated by solid circles.

It is considered that the difference in floating amount as described above is caused as follows. That is, the larger the aperture area (clearance area) is, the larger the leakage amount of air is. Accordingly, the floating amount of the semiconductor chip 28 is decreased in such a situation. On the contrary, the smaller the aperture area (clearance area) is, the smaller the leakage amount of air is. Accordingly, the floating amount of the semiconductor chip 28 is increased in such a situation.

Therefore, when the large number of semiconductor chips 28 transported by the transport apparatus 10 are picked up, the semiconductor chip 28e located at the terminal end Pb in the transport direction can be easily picked up by using an automatic transport arm without performing any manual operation. Thus, it is possible to realize the automatic operation to pick up individual objects of the large number of transported semiconductor chips 28 one by one. This results in the fully automatic operation for the entire transport system for the semiconductor chips 28.

When the transport apparatus 10 according to the embodiment of the present invention is installed in a production line for the semiconductor chips 28 or in a production line for electronic apparatuses or devices, the following embodiment of use may be considered.

At first, the plurality of transport passages 12 provided in the main apparatus body 14 are allotted to the quality levels of the semiconductor chips 28 respectively. For example, the first transport passage (transport passage located at the uppermost part in FIG. 1) 12A is allotted to transport the semiconductor chips 28 having the best quality. The second transport passage 12B is allotted to transport the semiconductor chips 28 having the second best quality. Similarly, the third, fourth, . . . and nth transport passages 12C, 12D, . . . 12N are allotted to transport the semiconductor chips 28 having the third, fourth, . . . and nth best qualities respectively.

The large number of semiconductor chips 28 are introduced into the corresponding transport passages 12 respectively depending on the quality level acknowledged for every one chip in the previous step, for example, in the inspection step. The introduction process can be performed by using, for example, a transport robot having an assigning mechanism. The large number of semiconductor chips 28 are assigned on the basis of the different quality levels, and they are introduced into the corresponding transport passages 12 respectively. The semiconductor chips 28 are transported through each of the transport passages 12 to the terminal end Pb in accordance with the air jetting and the inclination of the main apparatus body 14 while maintaining the floating state.

Each of the semiconductor chips 28, which has arrived at the terminal end Pb in each of the transport passages 12, is floated highest owing to the relationship concerning the aperture area (or the clearance area) as described above. At this stage, the semiconductor chips 28e floated highest over the respective transport passages 12 are picked up, for example, by the plurality of transport arms installed for each of the quality levels. The semiconductor chips 28e are then introduced into assembly lines for electronic apparatuses or devices installed for each of the quality levels. When one transport arm is commonly used for the plurality of transport passages 12A to 12n, the semiconductor chips 28 are picked up by the transport arm in an order starting from a certain transport passage 12 in which a predetermined number of semiconductor chips 28 are stored. The semiconductor chips 28 are introduced into the assembly line for electronic apparatuses or devices.

In this embodiment, the semiconductor chips 28 each having substantially the same quality level can be prepared in each of the transport passages 12. One type of apparatuses or devices can be assembled by using the semiconductor chips 28 having substantially the same quality transported by one transport passage, for example, in the following assembling step. Thus, it is possible to improve the quality of the apparatuses or devices.

As described above, the transport apparatus 10 according to the embodiment of the present invention makes it possible to perform the automatic operation for picking up individual semiconductor chips 28 one by one, and realize the fully automatic operation for the entire transport system for the semiconductor chips 28. Further, the air-jetting holes 26, which are provided through the groove bottom surface of the transport passage 12, are disposed at the five points with respect to the projected area of the semiconductor chip 28. Accordingly, all of the large number of semiconductor chips 28, which are placed on the transport passage 12, can be floated without any fluctuation. Thus, it is possible to avoid any retention of the semiconductor chips 28 on the transport passage 12. That is, all of the large number of semiconductor chips 28 can be efficiently transported in the transport direction by means of the respective transport passages 12.

Next, several modified embodiments of the transport apparatus 10 according to the embodiment of the present invention will be explained below with reference to FIGS. 7 to 12. Components or parts which are the same as those shown in FIGS. 1 to 6 are designated by the same reference numerals.

Figure 7:
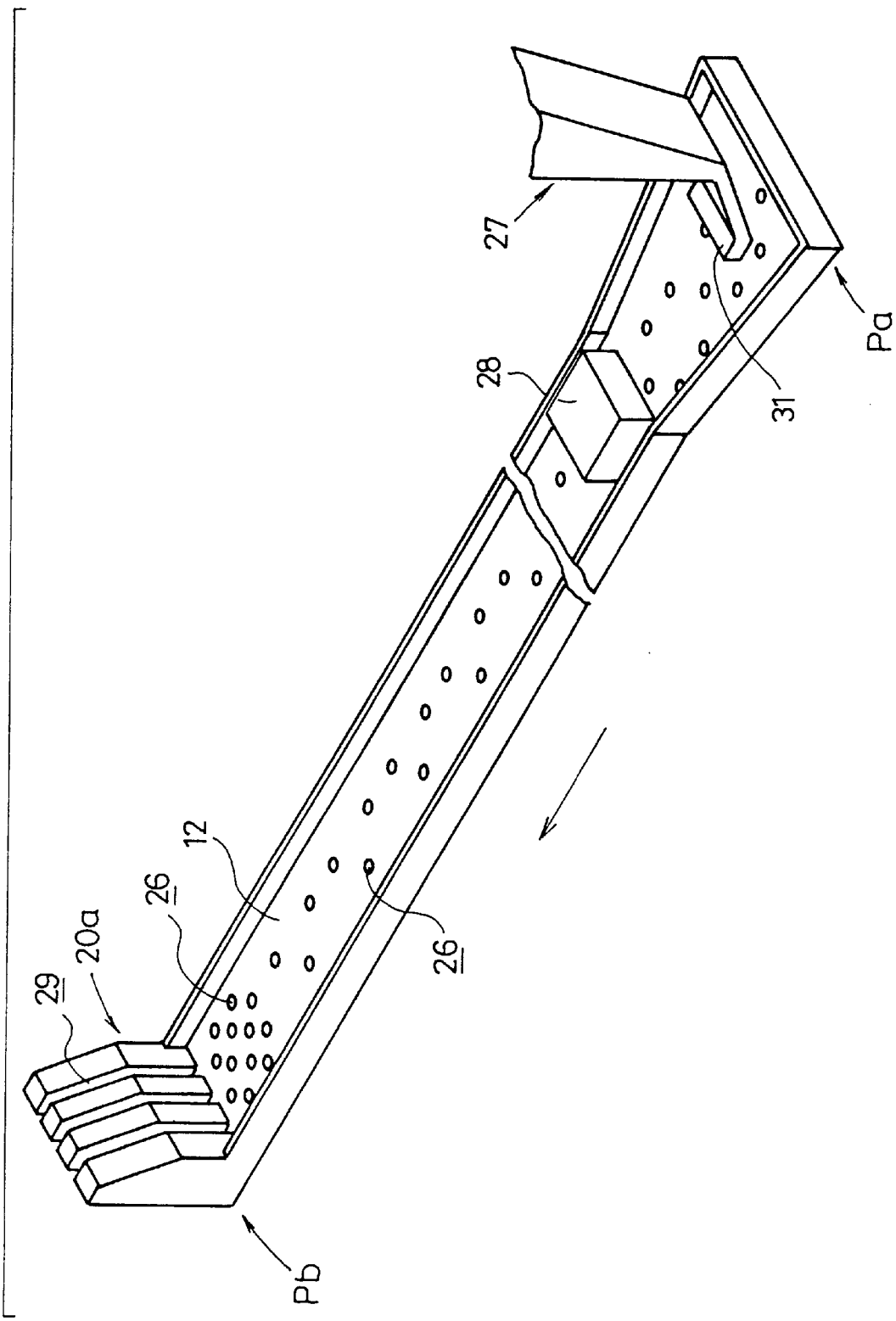
FIG. 7 shows a schematic perspective view illustrating a transport apparatus according to a first modified embodiment.

At first, as shown in FIG. 7, a transport apparatus 10 according to a first modified embodiment is constructed in approximately the same manner as the transport apparatus 10 according to the above described first embodiment of the present invention. However, the former is different from the latter in that an air blow pipe 27 is provided at the starting end Pa in the transport direction (direction indicated by the arrow in FIG. 7) of the transport passage 12, the opening of the transport surface at the terminal end Pa in the transport direction is not especially narrowed as compared with the other portions, the number of air-jetting holes 26 provided through the transport surface at the terminal end Pa is large as compared with the other portion, and a plurality of slits 29 are provided vertically through the terminal end wall 20a in the transport direction.

The air blow pipe 27 is connected to the air supply system comprising, for example, the unillustrated air pump and the electromagnetic valve. Thus, an arrangement is given, in which the air is jetted toward the semiconductor chip 28 from a nozzle 31 disposed at the forward end of the air blow pipe 27 (air pressure: about 0.1 to 0.5 kgf/cm$^2$). The opening of the transport surface at the starting end Pa has a width which is wider than those of the other portions. For this reason, the phenomenon would be otherwise caused, in which the floating state of the semiconductor chip 28 is not stabilized or the semiconductor chip 28 is not floated, due to, for example, fluctuation of the pressure of air discharged from the air-jetting holes 26 provided through the transport surface. However, in the present invention, this phenomenon is avoided owing to the arrangement as described above. Accordingly, it is possible to smoothly transport the semiconductor chips 28.

The number of the air-jetting holes 26 for the transport surface at the terminal end Pb is larger than those for the other portions. Therefore, the semiconductor chip 28 can be floated highest without especially narrowing the width of the opening of the transport surface at the terminal end Pb as compared with the other portions. The specified number of the air-jetting holes 26 to be installed can be individually determined considering the condition concerning the semiconductor chip 28 such as the shape and the weight and the condition concerning the transport apparatus 10 such as the aperture area of the transport surface of the transport passage 12.

The plurality of slits 29 are vertically provided through the terminal end wall 20a in the transport direction. Therefore, a part of the air for moving the semiconductor chip 28 in the transport direction or a part of the air for floating the semiconductor chip 28 leaks rearwardly and upwardly (in the leftward direction and in the upward direction in FIG. 7) at the terminal end wall 20 in the transport direction. Thus, the semiconductor chip 28 is smoothly moved in the transport direction, and it is possible to adjust the floating amount of the semiconductor chip 28. As described above, it is possible to avoid a phenomenon, which would be otherwise caused, that the terminal end wall 20a in the transport direction makes a so-called drift of air. Accordingly, it is possible to avoid adhesion of foreign matters to the terminal end wall 20a in the transport direction, and the adhesion of the foreign matters to the semiconductor chip 28 which collides with the terminal end wall 20a in the transport direction. Only one groove is schematically shown as the transport passage 12 in FIG. 7. However, the transport apparatus 10 according to the embodiment of the present invention may be provided with a plurality of grooves as the transport passages 12 corresponding to the qualities of the semiconductor chips 28, wherein it is possible to adjust the transport condition for each of the transport passages 12 by changing and adjusting the condition for forming the slit 29 for each of the transport passages 12.

Figure 8:
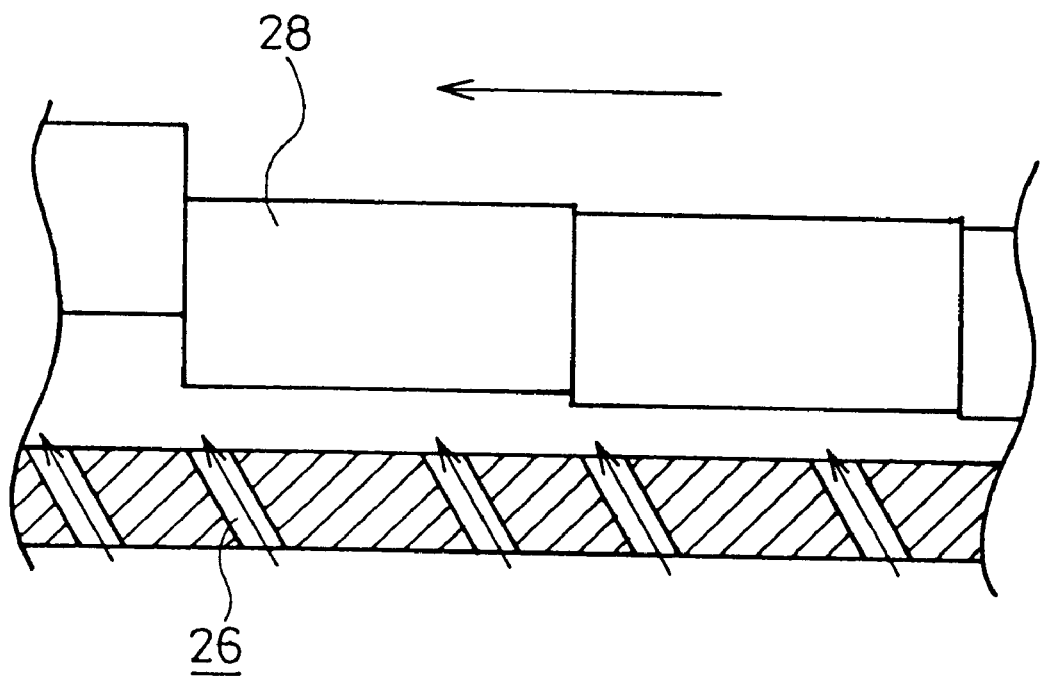
FIG. 8 illustrates an example of the jetting direction of air-jetting holes formed through the transport surface in a transport apparatus according to a second modified embodiment, with partial cutout of the transport apparatus.

A transport apparatus 10 according to a second modified embodiment shown in FIG. 8 is constructed in approximately the same manner as the transport apparatus 10 according to the first embodiment of the present invention. However, the former is different from the latter in that the air-jetting direction of the air-jetting holes 26 provided through the transport surface is not in the upright direction, but it is inclined with respect to the transport direction (direction indicated by the arrow in FIG. 8). The air, which is discharged from the air-jetting holes 26, gives the semiconductor chips 28 the floating force as well as the force (thrust) for moving in the transport direction.

Accordingly, the transport apparatus 10 is allowed to have a simple structure. The equipment cost is reduced, and the operation is simplified. Further, the simple structure makes it possible to perform the transport operation with high reliability.

A transport apparatus 10 according to a third modified embodiment shown in FIG. 9 is constructed in approximately the same manner as the transport apparatus 10 according to the first embodiment of the present invention. However, the former is different from the latter in that projections 30 are provided at the terminal end Pb of the transport passage 12. Specifically, the two projections 30 are provided and aligned in the lateral direction respectively on the surface of the terminal end wall 20 which closes the terminal end opening 12b of each of the transport passages 12, the surface being opposed to the terminal end opening 12b.

In the transport apparatus 10 according to this embodiment of the present invention, the semiconductor chip 28e, which has arrived at the terminal end Pb, makes surface-to-surface contact with the terminal end wall 20. Therefore, in order to float the semiconductor chip 28e located at the terminal end Pb, it is necessary that the air-jetting force exerted on the semiconductor chip 28e is not less than the contact frictional force of the surface-to-surface contact. Considering the balance with respect to the floating amount of the semiconductor chip 28 which is in the transport process, it may be difficult to adjust the air-jetting amount. Further, as described above, the problem may be caused in that foreign matters would adhere to the chip 28e.

However, in the transport apparatus 10 according to the third modified embodiment, the projections 30 are provided at the terminal end Pb. Therefore, the semiconductor chip 28e, which has arrived at the terminal end Pb, abuts against the projections 30 in point-to-point contact or in line-to-line contact therewith. Accordingly, it is possible to decrease the air-jetting force exerted on the semiconductor chip 28e. Thus, it is easy to adjust the air-jetting amount and perform other operations. Further, the adhesion of foreign matters to the semiconductor chip 28e disappears.

A transport apparatus 10 according to a fourth modified embodiment shown in FIG. 10 is constructed in approximately the same manner as the transport apparatus 10 according to the first modified embodiment described above. However, the former is different from the latter in that projections 30 are provided at the terminal end Pb of the transport passage 12, and projections 32 are provided at the terminal end portion of the semiconductor chip 28e.

In this embodiment, the semiconductor chip 28, which has arrived at the terminal end Pb, abuts against the following semiconductor chip 28 in line-to-line contact (or in point-to-point contact) with the projections 32 located at the rear end thereof in the transport direction. Therefore, it is possible to further decrease the air-jetting force to be exerted on the semiconductor chip 28. It is possible to realize simplification of the control system and the structure of the air supply system.

A transport apparatus 10 according to a fifth modified embodiment shown in FIG. 11 is constructed in approximately the same manner as the transport apparatus 10 according to the first embodiment of the present invention.

However, the former is different from the latter in that the semiconductor chip 28 to be introduced has a substantially trapezoidal side configuration.

In this embodiment, for example, when the semiconductor chip 28 arrives at the terminal end Pb, the line-to-line contact is made between the semiconductor chip 28e and the terminal end wall 20 and between the semiconductor chip 28e and the following semiconductor chip 28c respectively. Especially, when the semiconductor chip 28e located at the terminal end Pb is floated upwardly by jetting the air, the rear end of the semiconductor chip 28e is moved along the tapered surface (surface inclined upwardly in the direction to make separation from the terminal end Pb) of the front end of the following semiconductor chip 28. Therefore, as the semiconductor chip 28 located at the terminal end Pb is floated upwardly, the following semiconductor chip 28 is moved while making advance into the space under the semiconductor chip 28e disposed at the terminal end Pb. Accordingly, the semiconductor chip 28e, which is located at the terminal end Pb, is easily floated higher than the other semiconductor chips 28.

In the transport apparatus 10 according to the first embodiment of the present invention and in the transport apparatuses 10 according to the several modified embodiments, the method for inclining the main apparatus body 14, for example, by 1° with respect to the transport direction is carried out as shown in FIG. 2 by appropriately adjusting the screwing amount of the screw 24 screwed into the main apparatus body 14 from the bottom surface side of the base pedestal 16. Alternatively, as shown in FIG. 12, it is preferable to use lifting-rotating mechanisms 40A, 40B.

Figure 12:
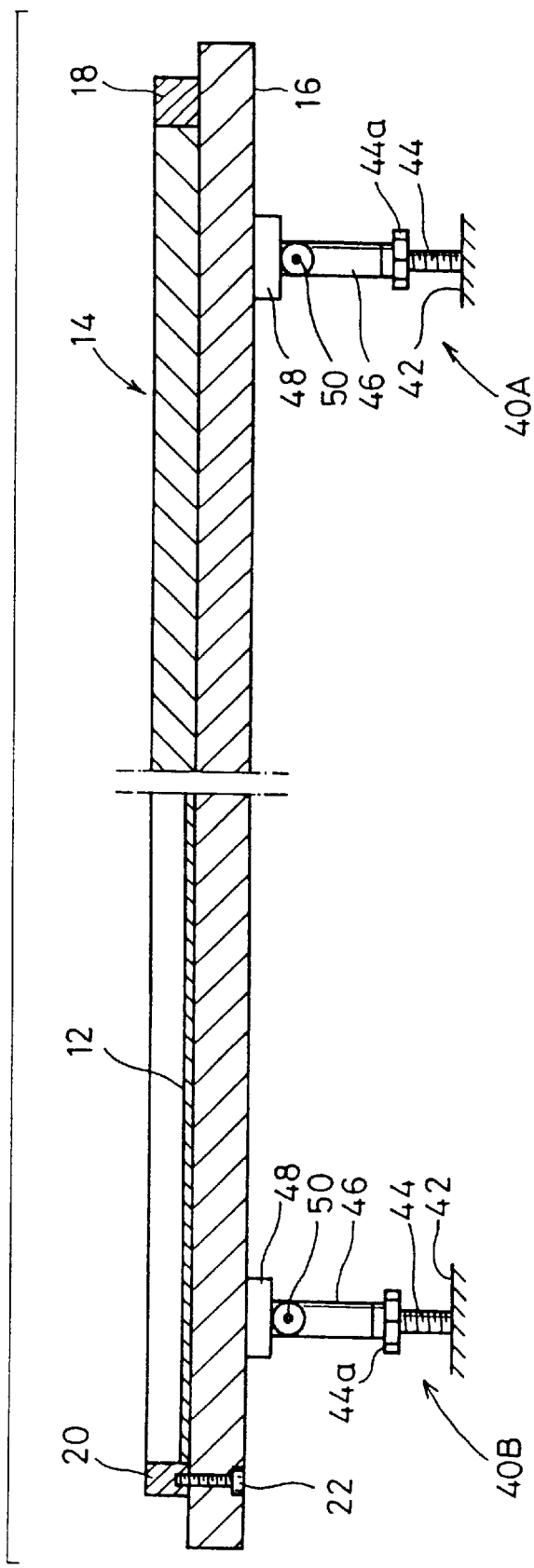
FIG. 12 shows an arrangement of another embodiment concerning a mechanism for inclining a main apparatus body, for example, by 1° with respect to the transport direction, in the transport apparatus according to the embodiment of the present invention.

As shown in FIG. 12, each of the lifting-rotating mechanisms 40A, 40B comprises, for example, a bolt member 44 screwed in the vertical direction into a stage 42 which is installed for a production line for producing parts or components, a support member 46 placed on a head 44a of the bolt member 44, an attachment plate 48 secured to the bottom surface of a base pedestal 16, and a support shaft 50 provided for rotatably attaching the support member 46 to the attachment plate 48.

The screwing amount of the bolt member 44 into the stage 42 is decreased by rotating the bolt member 44 of the lifting-rotating mechanism 40A disposed on the side of the starting end opening 12a of the transport passage 12, or the screwing amount of the bolt member 44 into the stage 42 is increased by rotating the bolt member 44 of the lifting-rotating mechanism 40B disposed on the side of the terminal end opening 12b of the transport passage 12. Thus, the main apparatus body 14 can be easily supported, for example, at an angle of inclination of 1° with respect to the transport direction.

The transport apparatus 10 according to the embodiment of the present invention and the transport apparatuses 10 according to the several modified embodiments have been described as exemplified by the application to the transport apparatus 10 for transporting the large number of semiconductor chips 28 in one direction. However, the transport apparatus 10 according to the present invention can be also applied to transport various types of small-sized objects.

It is a matter of course that the object transport apparatus according to the present invention is not limited to the embodiments described above, which may be embodied in other various forms without deviating from the gist or essential characteristics of the present invention.

Industrial Applicability

As explained above, the object transport apparatus according to the present invention is provided with at least one line of groove for constructing a transport passage for an object, wherein the transport passage comprises a mechanism for moving the object in a transport direction, a floating mechanism for the object, and a floating-accelerating mechanism for the object disposed at a terminal end in the transport direction.

Accordingly, an effect is achieved in that the transport system is realized in which the object is transported in one direction while floating the object by means of air. Especially, it is possible to realize the automatic operation for picking up individual objects one by one.

What is claimed is:

1. An object transport apparatus for transporting an object, said object transport apparatus comprising:

a main apparatus body having at least one groove, said at least one groove having a groove surface, said groove defining a transport passage above said groove surface, said groove surface comprising at least a transport surface;

at least one means for moving said object in a transport direction through said transport passage;

at least one floating means for floating said object above said transport surface; and at least one means for increasing floating which increases a height of floating of said object above said transport surface at a terminal end of said transport passage in said transport direction.

2. The object transport apparatus according to claim 1, wherein said means for moving said object in said transport direction comprises at least one of:

a means for inclining said transport passage downwardly by a predetermined angle toward said transport direction, a plurality of air-jetting holes which are formed through said transport surface so that air is jetted toward said transport direction, and a pushing means provided at a starting end of said transport passage in said transport direction for pushing said object in said transport direction.

3. The object transport apparatus according to claim 1, wherein said floating means comprises a plurality of air-jetting holes which are formed through said transport surface.

4. The object transport apparatus according to claim 1, wherein said floating-increasing means comprises at least one of:

said transport passage having a shape which provides a floating amount of said object at said terminal end in said transport direction which is larger than a floating amount of said object at positions in said transport passage other than said terminal end, and said transport surface having a larger number of air-jetting holes at said terminal end that at positions in said transport surface other than at said terminal end, for increasing an air-jetting amount of said air-jetting holes at said terminal end in said transport direction as compared with an air-jetting amount of said air-jetting holes at positions in said transport surface other than said terminal end in said transport direction.

5. The object transport apparatus according to claim 1, wherein a plurality of grooves are provided in said main apparatus body, each said groove having a groove surface defining a respective transport passage, each said groove having a respective transport surface extending in a respective transport direction, each of said respective transport directions being substantially parallel to one another in a number of lines corresponding to quality levels of said objects.

6. The object transport apparatus according to claim 1, wherein said air-jetting holes are provided at three points or more with respect to a projected area of said object.

7. The object transport apparatus according to claim 1, wherein said transport passage has a planar configuration in which a clearance area is decreased stepwise in said transport direction provided that said clearance area is an area obtained by subtracting a projected area of said object from an area of an object transport surface of said transport passage.

8. The object transport apparatus according to claim 1, wherein a slit is provided through a terminal end wall of said transport passage in said transport direction.

9. The object transport apparatus according to claim 1, wherein said object is an electronic part.

10. The object transport apparatus according to claim 1, wherein said transport surface is a substantially flat surface at a bottom of said groove.

11. The object transport apparatus according to claim 1, wherein said groove surface comprises said transport surface, a first groove side surface and a second groove side surface, said first and second groove side surfaces being substantially parallel to each other and substantially perpendicular to said transport surface.

12. The object transport apparatus according to claim 1, wherein a projection is provided on a terminal end wall of said transport passage in said transport direction.

13. The object transport apparatus according to claim 12, wherein a projection is provided at a rear end of said object in said transport direction.

* * * * *